US012690272B2

(12) United States Patent
Tseng et al.

(10) Patent No.: US 12,690,272 B2
(45) Date of Patent: Jul. 21, 2026

(54) ELECTRONIC DEVICE

(71) Applicant: Innolux Corporation, Miao-Li County (TW)

(72) Inventors: Ming-Chun Tseng, Miao-Li County (TW); Kung-Chen Kuo, Miao-Li County (TW); Lien-Hsiang Chen, Miao-Li County (TW); Yong-Zhi Liu, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 993 days.

(21) Appl. No.: 17/863,418

(22) Filed: Jul. 13, 2022

(65) Prior Publication Data

US 2023/0066908 A1     Mar. 2, 2023

Related U.S. Application Data

(60) Provisional application No. 63/238,781, filed on Aug. 31, 2021.

(30) Foreign Application Priority Data

May 25, 2022    (CN) .......................... 202210576966.4

(51) Int. Cl.
H10D 89/60          (2025.01)

(52) U.S. Cl.
CPC ......... H10D 89/811 (2025.01); H10D 89/611 (2025.01)

(58) Field of Classification Search
CPC ............................ H10D 89/811; H10D 89/611
See application file for complete search history.

(56) References Cited

U.S. PATENT DOCUMENTS

| | | | | |
|---|---|---|---|---|
| 5,446,302 | A | * 8/1995 | Beigel | ................. H10D 89/711 |
| | | | | 257/586 |
| 7,532,446 | B2 | 5/2009 | Cheng et al. | |
| 2020/0090579 | A1 * | 3/2020 | Chen | ........................ G09G 3/32 |
| 2021/0090496 | A1 | 3/2021 | Yue et al. | |
| 2021/0125558 | A1 * | 4/2021 | Yue | ...................... G09G 3/3258 |

(Continued)

FOREIGN PATENT DOCUMENTS

| | | |
|---|---|---|
| CN | 101048867 | 10/2007 |
| CN | 108269801 | 3/2021 |
| CN | 113160753 | 7/2021 |

(Continued)

OTHER PUBLICATIONS

"Office action of China Counterpart Application ," issued on Sep. 23 2024, p. 1-p. 12, in which the listed reference was/ references were cited.

(Continued)

*Primary Examiner* — Jeff W Natalini
*Assistant Examiner* — Jacob Raul Marin
(74) *Attorney, Agent, or Firm* — JCIPRNET

(57) ABSTRACT

An electronic device is provided. The electronic device includes a driving transistor, a semiconductor unit and an electrostatic discharge protection (EDP) circuit. The semiconductor unit has a first terminal coupled to a first terminal of the driving transistor. The EDP circuit is coupled to a node between the first terminal of the driving transistor and the first terminal of the semiconductor unit.

17 Claims, 7 Drawing Sheets

(56)                    References Cited

U.S. PATENT DOCUMENTS

| | | | |
|---|---|---|---|
| 2021/0225290 A1* | 7/2021 | Kang | G09G 3/3275 |
| 2021/0408786 A1* | 12/2021 | Dundigal | H10D 89/921 |

FOREIGN PATENT DOCUMENTS

| | | | | |
|---|---|---|---|---|
| CN | 113544763 A * | 10/2021 | | G09G 3/3233 |
| DE | 102005022763 B4 * | 2/2018 | | H03K 17/6871 |
| TW | I744822 | 11/2021 | | |

OTHER PUBLICATIONS

"Office Action of Taiwan Counterpart Application", issued on Apr. 11, 2023, p. 1-p. 7.

* cited by examiner

ELECTRONIC DEVICE

CROSS-REFERENCE TO RELATED APPLICATION

This application claims the priority benefit of US provisional application Ser. No. 63/238,781, filed on Aug. 31, 2021, and China application serial no. 202210576966.4, filed on May 25, 2022. The entirety of each of the above-mentioned patent applications is hereby incorporated by reference herein and made a part of this specification.

BACKGROUND

Technical Field

The disclosure relates to an electronic device, and in particular relates to an electronic device including an electrostatic discharge protection circuit.

Description of Related Art

Generally, electronic devices with display functions include semiconductor electronic elements, such as light-emitting diodes (LEDs). However, the threshold voltage of the semiconductor electronic element may be shifted, causing the current flowing through the semiconductor electronic element to increase or decrease, resulting in chromatic aberration in the display of the electronic device. In view of this, in order to avoid the chromatic aberration problem caused by the shift of the threshold voltage of the semiconductor electronic element in the electronic device, the following solutions is proposed in several embodiments.

SUMMARY

The disclosure is directed to an electronic device capable of removing the static electricity to prevent the threshold voltage of semiconductor electronic element from being shifted.

According to an embodiment of the disclosure, the electronic device of the disclosure includes a driving transistor, a semiconductor unit, and an electrostatic discharge protection circuit. The semiconductor unit has a first terminal coupled to the driving transistor. The electrostatic discharge protection circuit is coupled to a node between the first terminal of the driving transistor and the first terminal of the semiconductor unit.

Based on the above, the electronic device of the disclosure may discharge the static electricity when the electronic device generates static electricity through the electrostatic discharge protection circuit coupled between the driving transistor and the semiconductor unit, such that the threshold voltage of the driving transistor is not affected.

The disclosure may be understood by referring to the following detailed description in conjunction with the accompanying drawings. It should be noted that, for the ease of understanding by the readers and for the brevity of the accompanying drawings, multiple drawings in the disclosure only depict a portion of the display device, and the specific components in the drawings are not drawn according to the actual scale. In addition, the number and size of each of the elements in the figures are for illustration purposes only, and are not intended to limit the scope of the disclosure.

DETAILED DESCRIPTION OF DISCLOSED EMBODIMENTS

Certain terms may be used throughout the disclosure and the appended claims to refer to specific elements. It should be understood by those skilled in the art that display device manufacturers may refer to the same components by different names. The disclosure does not intend to distinguish between components that have the same function but have different names. In the following description and claims, words such as "comprising" and "including" are open-ended words, so they should be interpreted as meaning "including but not limited to . . . ".

In some embodiments of the disclosure, terms related to joining and connecting, such as "coupled", "interconnected", etc., unless otherwise defined, may mean that two structures are in direct contact, or may also mean that two structures are not in direct contact, in which there are other structures located between these two structures. The terms related to joining and connecting may also include the case where both structures are movable, or both structures are fixed. Furthermore, the term "coupled" includes any direct and indirect electrical connection, direct and indirect structural connection, or direct and indirect signal connection.

The terms such as "first", "second", etc. used in the description and the claims are used to modify elements, which do not imply and represent that the elements have any previous ordinal numbers, and also does not represent the order of a certain element and another element, or the order of the manufacturing method. The use of the ordinal numbers is to only clearly distinguish an element with a certain name from another element with the same name. The same terms may not be used in the claims and the description, and accordingly, the first component in the description may be the second component in the claims. It should be noted that, in the following embodiments, the technical features in several different embodiments may be replaced, reorganized, and mixed to complete other embodiments without departing from the spirit of the disclosure.

Figure 1:
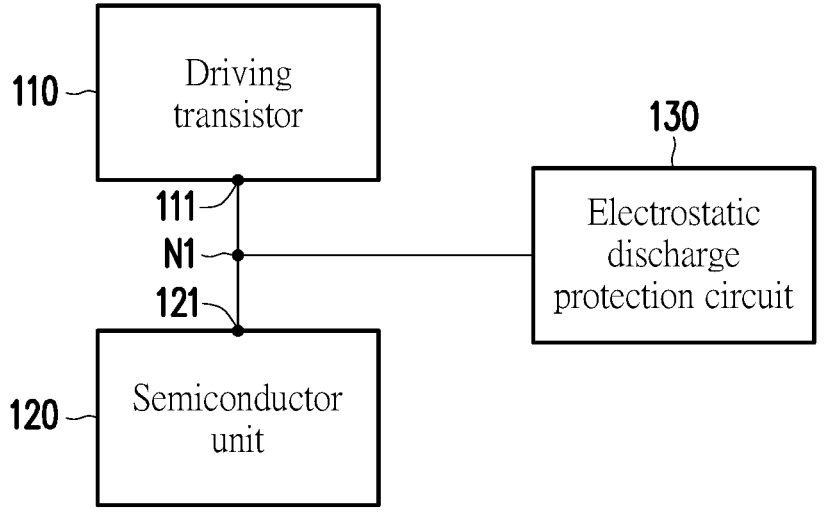
FIG. 1 is a circuit block schematic diagram of an electronic device according to an embodiment of the disclosure.

FIG. 1 is a circuit block schematic diagram of an electronic device according to an embodiment of the disclosure. Referring to FIG. 1, an electronic device 100 is, for example, a display panel. In some embodiments, the electronic device 100 may include a display device, an antenna device, a sensing device, or a splicing device, but is not limited thereto. The electronic device 100 may be a bendable or flexible electronic device. The electronic device 100 may include, for example, liquid crystals and light-emitting diodes. The light emitting diode may include, for example, an organic light-emitting diode (OLED), a mini light-emitting diode (mini LED), a micro light-emitting diode (micro LED), or a quantum dot light-emitting diode (quantum dot, QD, such as QLED, QDLED), fluorescence, phosphor, or other suitable materials, and the materials may be any arrangement and combination, but not limited thereto. The antenna device may be, for example, a liquid crystal antenna, but not limited thereto. The splicing device may be, for example, a display splicing device or an antenna splicing device, but not limited thereto. It should be noted that, the electronic device 100 may be any arrangement and combination thereof, but not limited thereto. Hereinafter, the display device is used as the electronic device 100 or the splicing device to illustrate the disclosure, but the disclosure is not limited thereto.

In this embodiment, the electronic device 100 includes a driving transistor 110, a semiconductor unit 120, and an electrostatic discharge protection (EDP) circuit 130. In this embodiment, the driving transistor 110, the semiconductor unit 120, and the electrostatic discharge protection circuit 130 are all disposed in the pixel display area of the display panel. In some embodiments, the driving transistor 110 and the semiconductor unit 120 are disposed in the pixel display area of the display panel, and the electrostatic discharge protection circuit 130 is disposed in the peripheral area outside the pixel display area. In this embodiment, the electronic device 100 may further include a driving circuit (not shown). The driving circuit may control the driving transistor 110 to drive the semiconductor unit 120.

According to design requirements, in some embodiments, multiple semiconductor units 120 are disposed, and the number and arrangement thereof may be determined according to actual requirements. According to practical applications, the semiconductor unit 120 may include a diode, a photodiode, a light-emitting diode (LED), a micro-LED, an organic light-emitting diode (OLED), an inorganic light-emitting diode (ILED), an mini-LED, an electroluminescence (EL) component, a laser diode, or other types of semiconductor electronic elements or light-emitting elements, which are not limited in this embodiment.

In this embodiment, a first terminal 111 of the driving transistor 110 is coupled to a first terminal 121 of the semiconductor unit 120. The first terminal 111 of the driving transistor 110 may output a driving current to the first terminal 121 (e.g., an anode terminal) of the semiconductor unit 120 to drive the semiconductor unit 120. In this embodiment, the driving transistor 110 is, for example, a p-type metal-oxide-semiconductor field-effect transistor (PMOS-FET). The first terminal 111 of the driving transistor 110 is, for example, a drain terminal. According to design requirements, in some embodiments, the driving transistor 110 is, for example, an n-type metal-oxide-semiconductor field-effect transistor (NMOSFET). The first terminal 111 of the driving transistor 110 is, for example, a source terminal.

In this embodiment, the electrostatic discharge protection circuit 130 is coupled to a node between the first terminal 111 of the driving transistor 110 and the first terminal 121 of the semiconductor unit 120. In other words, the node refers to any node on the current path of the driving current between the driving transistor 110 and the semiconductor unit 120, for example, a node N1 or a node N2, but not limited thereto.

It is worth mentioning here that, during the manufacturing process of the electronic device 100, when the driving circuit or the driving transistor 110 of the electronic device 100 generates static electricity, the electrostatic discharge protection circuit 130 is enabled to discharge the static electricity. In this way, even if static electricity is formed on any terminal of the driving transistor 110, the static electricity may be discharged by the electrostatic discharge protection circuit 130, to prevent the threshold voltage of the driving transistor 110 from being shifted. In other words, the threshold voltage of the driving transistor 110 is not affected, so when the semiconductor unit in the electronic device is a light-emitting unit, the electronic device may avoid generating chromatic aberration.

Figure 2:
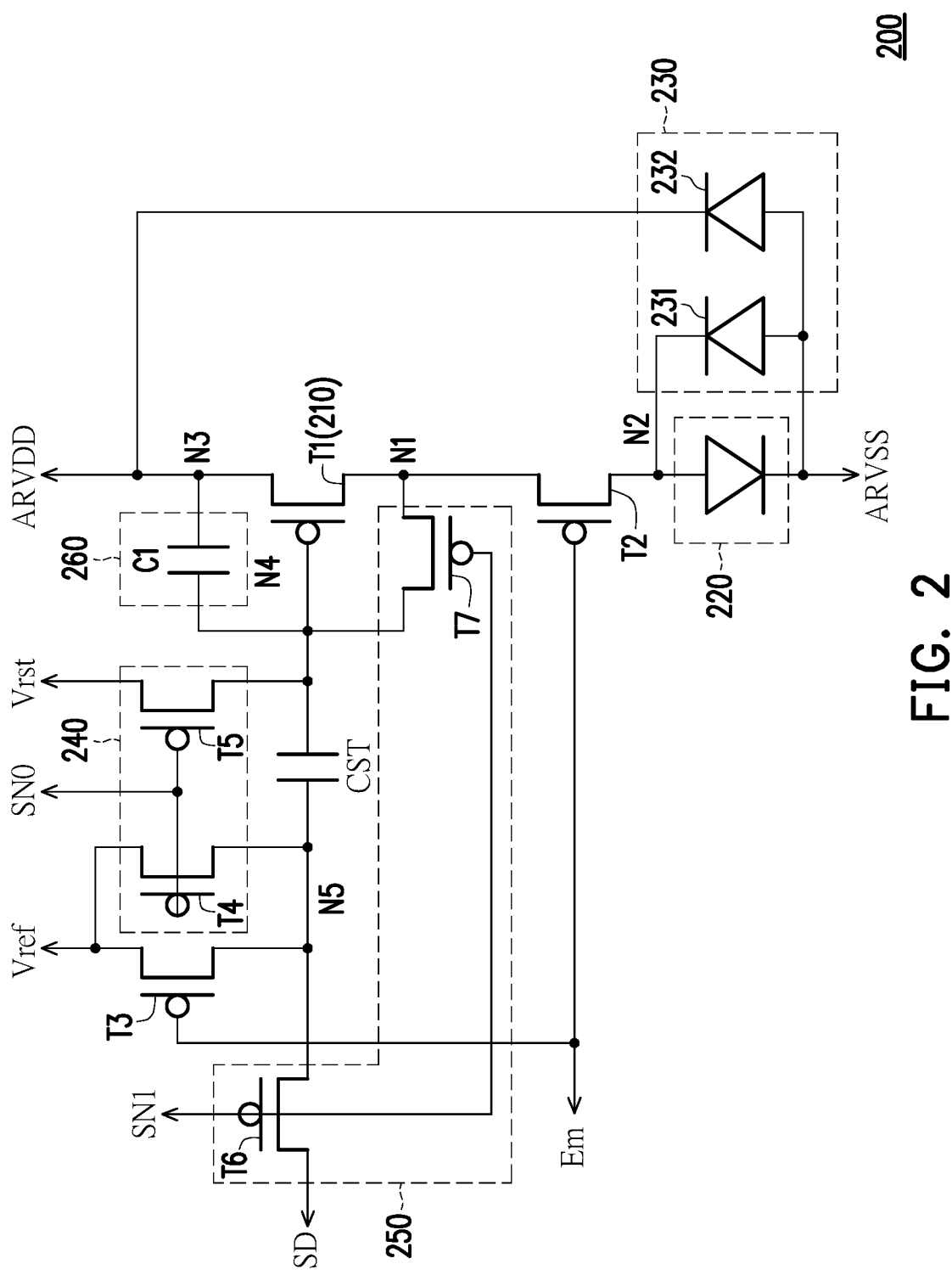
FIG. 2 is a circuit schematic diagram of an electronic device according to an embodiment of the disclosure.

FIG. 2 is a circuit schematic diagram of an electronic device according to an embodiment of the disclosure. Referring to FIG. 2, an electronic device 200 includes a driving transistor 210, a semiconductor unit 220, an electrostatic discharge protection circuit 230, a reset circuit 240, a writing and compensation circuit 250, a voltage regulator circuit 260, a capacitor CST, a switching transistor T2, and a switching transistor T3. The driving transistor 210, the semiconductor unit 220, and the electrostatic discharge protection circuit 230 included in the electronic device 200 of FIG. 2 may be deduced with reference to the related description of the electronic device 100, and therefore is not repeated herein.

In this embodiment, the driving transistor 210, the semiconductor unit 220, the reset circuit 240, the writing and compensation circuit 250, the voltage regulator circuit 260, the capacitor CST, the switching transistor T2, and the switching transistor T3 are disposed in the pixel display area of the electronic device 200 (e.g., a display panel). The position where the electrostatic discharge protection circuit 230 is disposed is not limited. For example, in this embodiment, the electrostatic discharge protection circuit 230 may be disposed in the pixel display area. In some embodiments, the electrostatic discharge protection circuit 230 may be disposed in a peripheral area outside the pixel display area.

In this embodiment, the driving transistor 210 is implemented as a p-type transistor, and the driving transistor T1 is used as an illustration in the following embodiments. According to design requirements, in some embodiments, multiple driving transistors T1 are disposed, and the number and arrangement thereof may be determined according to actual requirements. In this embodiment, the first terminal (i.e., the drain terminal) of the driving transistor T1 is coupled to the writing and compensation circuit 250 at the node N1. The second terminal (i.e., the source terminal) of the driving transistor T1 is coupled to (receives) a first voltage ARVDD on a node N3. In this embodiment, the first voltage ARVDD is, for example, a reference high voltage. The control terminal (i.e., the gate terminal) of the driving transistor T1 is coupled to (receives) a data signal SD through the capacitor CST and the writing and compensation circuit 250.

In this embodiment, the semiconductor unit 220 is exemplified by a single light-emitting element. The first terminal (i.e., the anode terminal) of the semiconductor unit cell 220 receives the drive current at the node N2. The second terminal (i.e., the cathode terminal) of the semiconductor unit 220 is coupled to (receives) a second voltage ARVSS. In this embodiment, the second voltage ARVSS is, for example, a reference low voltage. In some embodiments, the second voltage ARVSS is, for example, grounded. In this embodiment, the voltage level of the first voltage ARVDD is higher than the voltage level of the second voltage ARVSS.

In this embodiment, the switching transistor T2 is implemented as a p-type transistor. In some embodiments, the switching transistor T2 is, for example, an n-type transistor. In the embodiment of FIG. 2, the first terminal (i.e., the drain terminal) of the switching transistor T2 is coupled to the first terminal (i.e., the anode terminal) of the semiconductor unit 220 at the node N2. The second terminal (i.e., the source terminal) of the switching transistor T2 is coupled to the first terminal (i.e., the drain terminal) of the driving transistor T1 at the node N1. The control terminal (i.e., the gate terminal) of the switching transistor T2 is coupled to (receives) a switching signal Em for a switching operation.

In this embodiment, the switching transistor T3 is implemented as a p-type transistor. In some embodiments, the switching transistor T3 is, for example, an n-type transistor. In the embodiment of FIG. 2, the first terminal (i.e., the drain terminal) of the switching transistor T3 is coupled to the writing and compensation circuit 250 at node N5, and is coupled to the control terminal (i.e., gate terminal) of the driving transistor T1 at node N4 through the capacitor CST. The second terminal (i.e., the source terminal) of the switching transistor T3 is coupled to (receives) a reference voltage Vref. The control terminal (i.e., the gate terminal) of the switching transistor T3 is coupled to (receives) a switching signal Em for a switching operation.

In this embodiment, the driving transistor 210, the switching transistor T2, and the switching transistor T3 may serve as a driving circuit to output the driving current to the semiconductor unit 220 during the enabling period of the switching signal Em.

In this embodiment, the first terminal of the electrostatic discharge protection circuit 230 is coupled to the node N2 between the first terminal (i.e., the drain terminal) of the driving transistor T1 and the first terminal (i.e., the anode terminal) of the semiconductor unit 220. The second terminal of the electrostatic discharge protection circuit 230 is coupled to (receives) the second voltage ARVSS, and the third terminal of the electrostatic discharge protection circuit 230 is coupled to the second terminal (i.e., the source terminal) of the driving transistor T1. In this embodiment, the electrostatic discharge protection circuit 230 includes at least one electronic element. The electronic elements are, for example, diodes or other semiconductor electronic elements, but not limited thereto. In some embodiments, the number of terminals of the electrostatic discharge protection circuit 230 may be different according to the number of electronic elements, and the number of terminals may be, for example, two terminals, three terminals, or more than three terminals, but not limited thereto.

Specifically, in this embodiment, the electronic elements of the electrostatic discharge protection circuit 230 include multiple diodes 231 to 232. The number of the diodes 231 or the diodes 232 in this embodiment is only an example. In some embodiments, the electronic elements of the electrostatic discharge protection circuit 230 may be, for example, only the diode 231 or the diode 232, but not limited thereto. The first terminal (i.e., the cathode terminal) of the diode 231 may, for example, serve as the first terminal of the electrostatic discharge protection circuit 230, and is coupled to the node N2. The second terminal (i.e., the anode terminal) of the diode 231 may, for example, serve as the second terminal of the electrostatic discharge protection circuit 230, and is coupled to (receives) the second voltage ARVSS. The first terminal (i.e., the cathode terminal) of the diode 232 may, for example, serve as the third terminal of the electrostatic discharge protection circuit 230, and is coupled between the second terminal (i.e., the source terminal) of the driving transistor T1 and the first voltage ARVDD. The second terminal (i.e., the anode terminal) of the diode 232 may, for example, serve as the second terminal of the electrostatic discharge protection circuit 230, and is coupled to the anode terminal of the diode 231 and coupled to (receives) the second voltage ARVSS.

In this embodiment, the reset circuit 240 is controlled by a first control voltage SN0. The multiple first terminals of the reset circuit 240 are respectively coupled to the two terminals of the capacitor CST, to reset the two terminals of the capacitor CST (including the control terminal of the driving transistor T1) during the enabling period of the first control voltage SN0. The multiple second terminals of the reset circuit 240 are respectively coupled to (receive) the reference voltage Vref or a reset voltage Vrst.

Specifically, in this embodiment, the reset circuit 240 includes a transistor T4 and a transistor T5. The transistor T4 and the transistor T5 in this embodiment are implemented as p-type transistors. In some embodiments, the transistor T4 and the transistor T5 may be, for example, n-type transistors, but not limited thereto. In the embodiment of FIG. 2, the first terminal (i.e., the drain terminal) of the transistor T4 is coupled to the first terminal of the capacitor CST, and is coupled to the writing and compensation circuit 250 at the node N5. The second terminal (i.e., the source terminal) of the transistor T4 is coupled to (receives) the reference voltage Vref. The first terminal (i.e., the drain terminal) of the transistor T5 is coupled to the second terminal of the capacitor CST, and is coupled to the control terminal (i.e., the gate terminal) of the driving transistor T1 at the node N4. The second terminal (i.e., the source terminal) of the transistor T5 is coupled to (receives) the reset voltage Vrst. The control terminal (i.e., the gate terminal) of the transistor T4 and the control terminal (i.e., the gate terminal) of the transistor T5 are coupled together, and are coupled to (receive) the first control voltage SN0.

In this embodiment, the writing and compensation circuit 250 is controlled by a second control voltage SN1. The first terminal of the writing and compensation circuit 250 is coupled to the first terminal of the coupling capacitor CST at the node N5. The other multiple terminals of the writing and compensation circuit 250 are respectively coupled to the node N1 and the node N4, and are coupled to (receive) the data signal SD. The writing and compensation circuit 250 may respectively compensate the node N4 and the node N5 and write the data signal SD during the enabling period of the second control voltage SN1.

Specifically, in this embodiment, the writing and compensation circuit 250 includes a transistor T6 and a transistor T7. The transistor T6 and the transistor T7 in this embodiment are implemented as p-type transistors. In some embodiments, the transistor T6 and the transistor T7 may be, for example, n-type transistors, but not limited thereto. In the embodiment of FIG. 2, the first terminal (i.e., the drain terminal) of the transistor T6 is coupled to the first terminal of the capacitor CST at node N5. The second terminal (i.e., the source terminal) of the transistor T6 is coupled to (receives) the data signal SD. The first terminal (i.e., the drain terminal) of the transistor T7 is coupled to the first terminal (i.e., the drain terminal) of the driving transistor T1 at the node N1. The second terminal (i.e., the source terminal) of the transistor T7 is coupled to the second terminal of the capacitor CST and the control terminal (i.e., the gate terminal) of the driving transistor T1 at the node N4. The control terminal (i.e., the gate terminal) of the transistor T7 and the control terminal (i.e., the gate terminal) of the transistor T6 are coupled together, and are coupled to (receive) the second control voltage SN1.

In this embodiment, the voltage regulator circuit 260 includes a capacitor C1, but not limited thereto. The first terminal of the capacitor C1 is coupled to the control terminal (i.e., the gate terminal) of the driving transistor T1 at the node N4. The second terminal of the capacitor C1 is coupled to the second terminal (i.e., the source terminal) of the driving transistor T1 and the first voltage ARVDD at the node N3. In this embodiment, the voltage regulator circuit 260 may stabilize the voltage difference between the second terminal (i.e., the source terminal) and the control terminal (i.e., the gate terminal) of the driving transistor T1 according to the first voltage ARVDD.

In this embodiment, the electronic device 200 may perform a reset operation, a compensation and data writing operation, and a driving operation, to realize the display function.

Specifically, in this embodiment, during the reset operation, the first control voltage SN0 has an enabling voltage level to enable the reset circuit 240. The second control voltage SN1 has a disabling voltage level such that the writing and compensation circuit 250 is disabled. The switching signal Em may have a disabling voltage level so that the switching transistor T2 and the switching transistor T3 are turned off.

In the present embodiment, during the compensation and data writing operation, the second control voltage SN1 has an enabling voltage level to enable the writing and compensation circuit 250. The first control voltage SN0 has a disabling voltage level such that the reset circuit 240 is disabled. The switching signal Em may have a disabling voltage level such that the switching transistor T2 and the switching transistor T3 are turned off.

In the present embodiment, during the driving operation, the switching signal Em has an enabling voltage level such that the switching transistor T2 and the switching transistor T3 are turned on. The first control voltage SN0 has a disabling voltage level such that the reset circuit 240 is disabled. The second control voltage SN1 has a disabling voltage level such that the writing and compensation circuit 250 is disabled.

Figure 3:
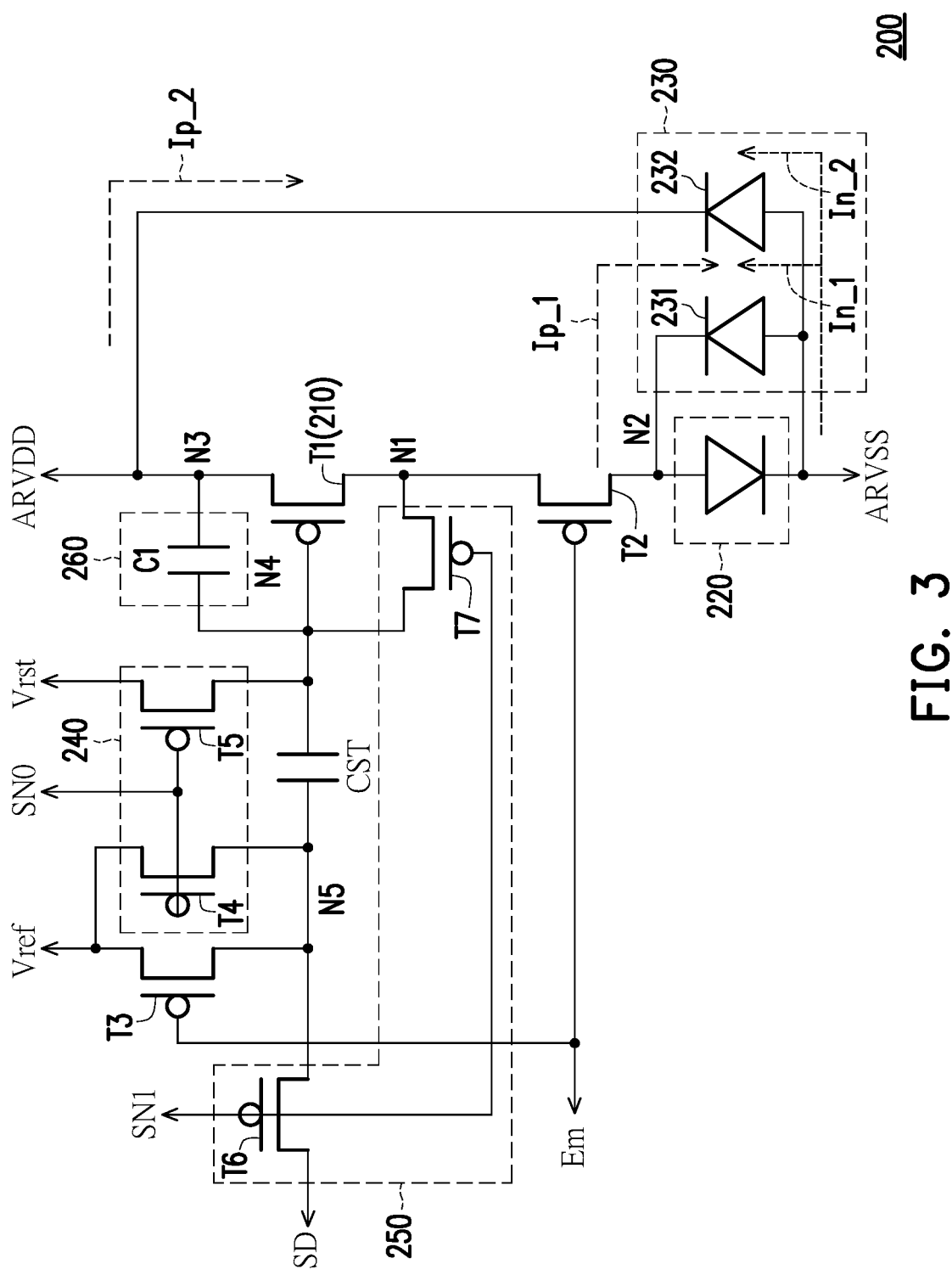
FIG. 3 is an operational schematic diagram of the electronic device according to the embodiment of FIG. 2 of the disclosure.

FIG. 3 is an operational schematic diagram of the electronic device according to the embodiment of FIG. 2 of the disclosure. In order to facilitate the description of the content of this disclosure, FIG. 3 only marks some of the elements. Referring to FIG. 3, in the electronic device 200, the node N3 and the node N2 are respectively coupled to the two terminals of the electrostatic discharge protection circuit 230. Therefore, when static electricity is generated at the node N3 and/or the node N2, the diode 231 and/or the diode 232 of the electrostatic discharge protection circuit 230 are enabled to discharge the static electricity without affecting the display quality of the electronic device 200. In some embodiments, the number of terminals of the electrostatic discharge protection circuit 230 may be different according to the number of electronic elements, and the number of terminals may be, for example, two terminals, three terminals, or more than three terminals, but not limited thereto. In addition, the position where each of the terminals of the electrostatic discharge protection circuit 230 is coupled may be determined according to the requirements. For example, the reset circuit 240, the writing and compensation circuit 250, the voltage regulator circuit 260, the capacitor CST, the switching transistor T2, the switching transistor T3, or the driving transistor T1 of the electronic device 200, or any node at which the aforementioned are coupled to may all be selectively coupled to the terminal of the electrostatic discharge protection circuit 230. When static energy is generated at the nodes coupled between the aforementioned circuits 240 to 260 or the electronic elements (CST, T1 to T3) and the electrostatic discharge protection circuit 230, the electrostatic discharge protection circuit 230 is enabled to discharge the static electricity.

In this embodiment, during the manufacturing process of the electronic device 200, when the first voltage ARVDD and the second voltage ARVSS have not been connected to the respective DC power sources, no static electricity is formed at any node in the electronic device 200. At this time, the electrostatic discharge protection circuit 230 is disabled.

In this embodiment, when the first voltage ARVDD and the second voltage ARVSS are connected to the respective DC power sources, assuming that static electricity with positive or negative charge is formed at the node N3 or the node N2, the electrostatic discharge protection circuit 230 is enabled to provide a discharge loop.

For example, if the static electricity of positive charge is formed at the node N2, the diode 231 is reversely conducted. The static electricity of positive charge may flow from the node N2, through the diode 231, to the anode terminal of the diode 231 to form a positive charge electrostatic current Ip_1. The positive charge electrostatic current Ip_1 is pulled to the second voltage ARVSS through the diode 231 to discharge the static electricity. On the other hand, if static electricity of positive charge is formed at the node N3, the diode 232 is reversely conducted. The static electricity of positive charge may flow from the node N3, through the diode 232, to the anode terminal of the diode 232 to form a positive charge electrostatic current Ip_2. The positive charge electrostatic current Ip_2 is pulled to the second voltage ARVSS through the diode 232 to discharge the static electricity.

For example, if the static electricity of negative charge is formed at the node N2, the diode 231 is forwardly conducted. The static electricity of the negative charge may flow from the anode terminal of the diode 231, through the diode 231, to the node N2 to form a negative charge electrostatic current In_1. The negative charge electrostatic current In_1 is pulled to the second voltage ARVSS through the diode 231 to discharge the static electricity. On the other hand, if static electricity of negative charge is formed at the node N3, the diode 232 is forwardly conducted. The static electricity of negative charge may flow from the anode terminal of the diode 232, through the diode 232, to the node N3 to form a negative charge electrostatic current In_2. The negative charge electrostatic current In_2 is pulled to the second voltage ARVSS through the diode 232 to discharge the static electricity.

In the disclosure, the electrostatic discharge protection circuit 230 coupled between the driving transistor T1 and the anode terminal of the semiconductor unit 220 may provide a discharge loop to discharge the static electricity when static electricity is generated. Therefore, in this embodiment, the driving transistor T1 and/or the switching transistor T2 may prevent the threshold voltage from shifting due to static electricity, so as to output a stable driving current. In some embodiments, when the semiconductor unit is a light-emitting unit, it is possible for the electronic device to avoid generating chromatic aberration.

Figure 4:
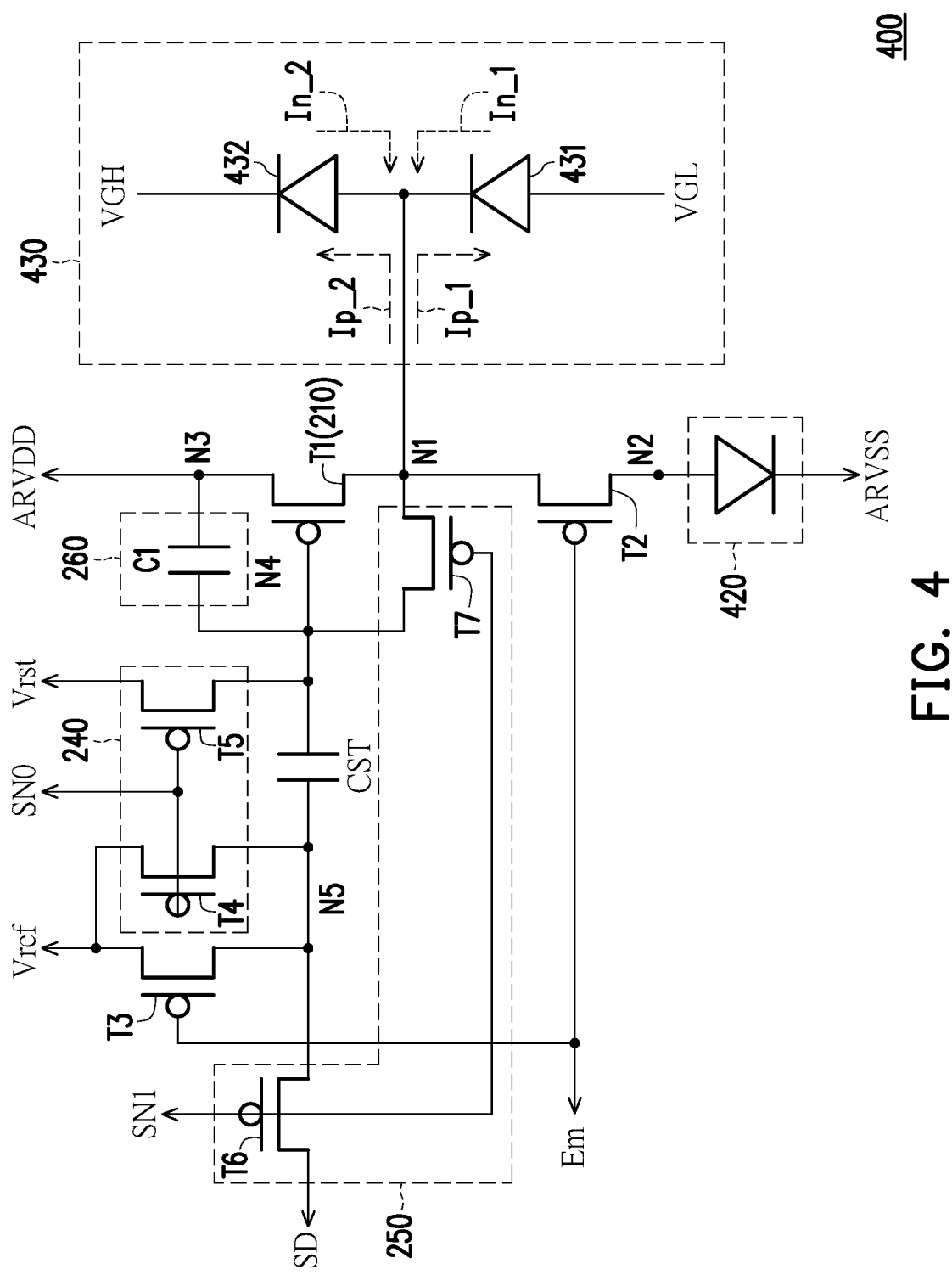
FIG. 4 is an operational schematic diagram of an electronic device according to another embodiment of the disclosure.

FIG. 4 is an operational schematic diagram of an electronic device according to another embodiment of the disclosure. In order to facilitate the description of the content of this disclosure, FIG. 4 only marks some of the elements. The driving transistor T1, a semiconductor unit 420, the reset circuit, the writing and compensation circuit, the voltage regulator circuit, the capacitor CST, and the switching transistor included in an electronic device 400 of FIG. 4 may be deduced with reference to the related description of the electronic device 200, and therefore is not repeated herein. In this embodiment, the driving transistor T1, the semiconductor unit 420, the reset circuit, the writing and compensation circuit, the voltage regulator circuit, the capacitor CST, and the switching transistor are all disposed in the pixel display area of the electronic device 400 (e.g., a display panel), a electrostatic discharge protection circuit 430 is disposed in the peripheral area outside the pixel display area, but not limited thereto. In some embodiments, the electrostatic discharge protection circuit 430 may be disposed in the pixel display area.

Referring to FIG. 4, the first terminal of the electrostatic discharge protection circuit 430 is coupled to the node N1 between the first terminal (i.e., the drain terminal) of the driving transistor T1 and the first terminal (i.e., the anode terminal) of the semiconductor unit 420. In this embodiment, the electrostatic discharge protection circuit 430 includes at least one electronic element. The electronic elements are, for example, diodes or other semiconductor electronic elements. In this embodiment, the first terminal of the electronic element is coupled to the node N1. The second terminal of the electronic element is coupled to (receives) a third voltage VGH or a fourth voltage VGL. In this embodiment, the voltage level of the third voltage VGH is higher than the voltage level of the fourth voltage VGL. The third voltage VGH is, for example, a reference high voltage. The fourth voltage VGL is, for example, a reference low voltage. In some embodiments, the voltage level of the third voltage VGH is equal to the voltage level of the first voltage ARVDD. The voltage level of the fourth voltage VGL is equal to the voltage level of the second voltage ARVSS.

Specifically, in this embodiment, the electronic elements of the electrostatic discharge protection circuit 430 include multiple diodes 431 to 432. The number of the diodes 431 or the diodes 432 in this embodiment is only an example. The first terminal (i.e., the cathode terminal) of the diode 431 is coupled to the node N1, and may, for example, serve as the first terminal of the electrostatic discharge protection circuit 430. The second terminal (i.e., the anode terminal) of the diode 431 is coupled to the fourth voltage VGL, and may, for example, serve as the second terminal of the electrostatic discharge protection circuit 430. The first terminal (i.e., the cathode terminal) of the diode 432 is coupled to the third voltage VGH, which may, for example, serve as the second terminal or the third terminal of the electrostatic discharge protection circuit 430, and the second terminal (i.e., the anode terminal) of the diode 432 terminal may, for example, serve as the first terminal of the electrostatic discharge protection circuit 430 and is coupled to the cathode terminal of the diode 431. In some embodiments, the fourth voltage may be, for example, grounded, but not limited thereto.

In this embodiment, in the electronic device 400, the node N1 is coupled to the terminal of the electrostatic discharge protection circuit 430. Therefore, when static electricity is generated at the node N1, the electrostatic discharge protection circuit 430 is enabled to discharge the static electricity without affecting the display quality of the electronic device 400. In some embodiments, the number of terminals of the electrostatic discharge protection circuit 430 may be different according to the number of electronic elements, and the number of terminals may be, for example, two terminals, three terminals, or more than three terminals, but not limited thereto. In addition, the position where each of the terminals of the electrostatic discharge protection circuit 430 is coupled may be determined according to the requirements. For example, the reset circuit, the writing and compensation circuit, the voltage regulator circuit, the capacitor CST, the switching transistor, or the driving transistor of the electronic device 400, or any node at which the aforementioned are coupled to may all be selectively coupled to the terminal of the electrostatic discharge protection circuit 430. When static energy is generated at the nodes coupled between the aforementioned circuits or the electronic elements and the electrostatic discharge protection circuit 430, the electrostatic discharge protection circuit 430 is enabled to discharge the static electricity.

In this embodiment, during the manufacturing process of the electronic device 400, when the first voltage ARVDD and the second voltage ARVSS have not been connected to the respective DC power sources, no static electricity is formed at any node in the electronic device 400. At this time, the electrostatic discharge protection circuit 430 is disabled.

In this embodiment, when the first voltage ARVDD and the second voltage ARVSS are connected to the respective DC power sources, assuming that static electricity with positive or negative charges is formed at the node N1, the electrostatic discharge protection circuit 430 is enabled to provide a discharge loop. In some embodiments, a node (e.g., such as N2, N3, N4, or N5) may be selectively and additionally coupled to the electrostatic discharge protection circuit 430, such that when static electricity is generated at the node N2, N3, N4, or N5, the electrostatic discharge protection circuit 430 is enabled to discharge the static electricity.

For example, if static electricity of positive charge is formed at the node N1 and the voltage of the node N1 is greater than the third voltage VGH, the diode 431 is reversely conducted, and the diode 432 is forwardly conducted. The positive charge electrostatic current Ip_1 is formed by flowing from the node N1 through the diode 431 and the anode terminal of the diode 431, and is pulled to the third voltage VGL through the diode 431 to discharge the static electricity. On the other hand, the positive charge electrostatic current Ip_2 is formed by flowing from the node N1 through the diode 432, the cathode terminal of the diode 432, and the third voltage VGH, and is pulled to the third voltage VGH through the diode 432 to discharge the static electricity. The positive charge electrostatic current Ip_2 forwardly conducted by the diode 432 may be much larger than the positive charge electrostatic current Ip_1 reversely conducted by the diode 431, the positive charge electrostatic current Ip_2 may be, for example, more than 1000 times as large as the positive charge electrostatic current Ip_1. In some embodiments, if the static electricity of positive charge is formed at the node N1, the diode 431 and the diode 432 may be, for example, both reversely conducted, but not limited thereto.

For example, if the static electricity of negative charge is formed at the node N1 and the voltage of the node N1 is lower than the fourth voltage VGL, the diode 431 is forwardly conducted, and the diode 432 is reversely conducted. The negative charge electrostatic current In_1 is formed by flowing from the anode terminal of the diode 431 through the diode 431 and the node N1, and is pulled to the fourth voltage VGL through the diode 431 to discharge the static electricity. On the other hand, the negative charge electrostatic current In_2 is formed by flowing from the cathode terminal of the diode 432 through the diode 432, the node N1, and the third voltage VGH, and is pulled to the third voltage VGH through the diode 432 to discharge the static electricity. The negative charge electrostatic current In_2 forwardly conducted by the diode 431 may be much larger than the negative charge electrostatic current In_1 reversely conducted by the diode 432, the negative charge electrostatic current In_2 may be, for example, more than 1000 times as large as the negative charge electrostatic current In_1. In some embodiments, if the static electricity of negative charge is formed at the node N1, the diode 431 and the diode 432 may be, for example, both reversely conducted, but not limited thereto.

In the disclosure, the electrostatic discharge protection circuit 430 coupled between the driving transistor T1 and the anode terminal of the semiconductor unit 420 may provide an additional discharge loop to discharge the static electricity when static electricity is generated. Therefore, in this embodiment, the driving transistor T1 and/or the switching transistor T2 may prevent the threshold voltage from shifting due to static electricity, so as to output a stable driving current. In some embodiments, when the semiconductor unit is a light-emitting unit, it is possible for the electronic device to avoid generating chromatic aberration.

Figure 5:
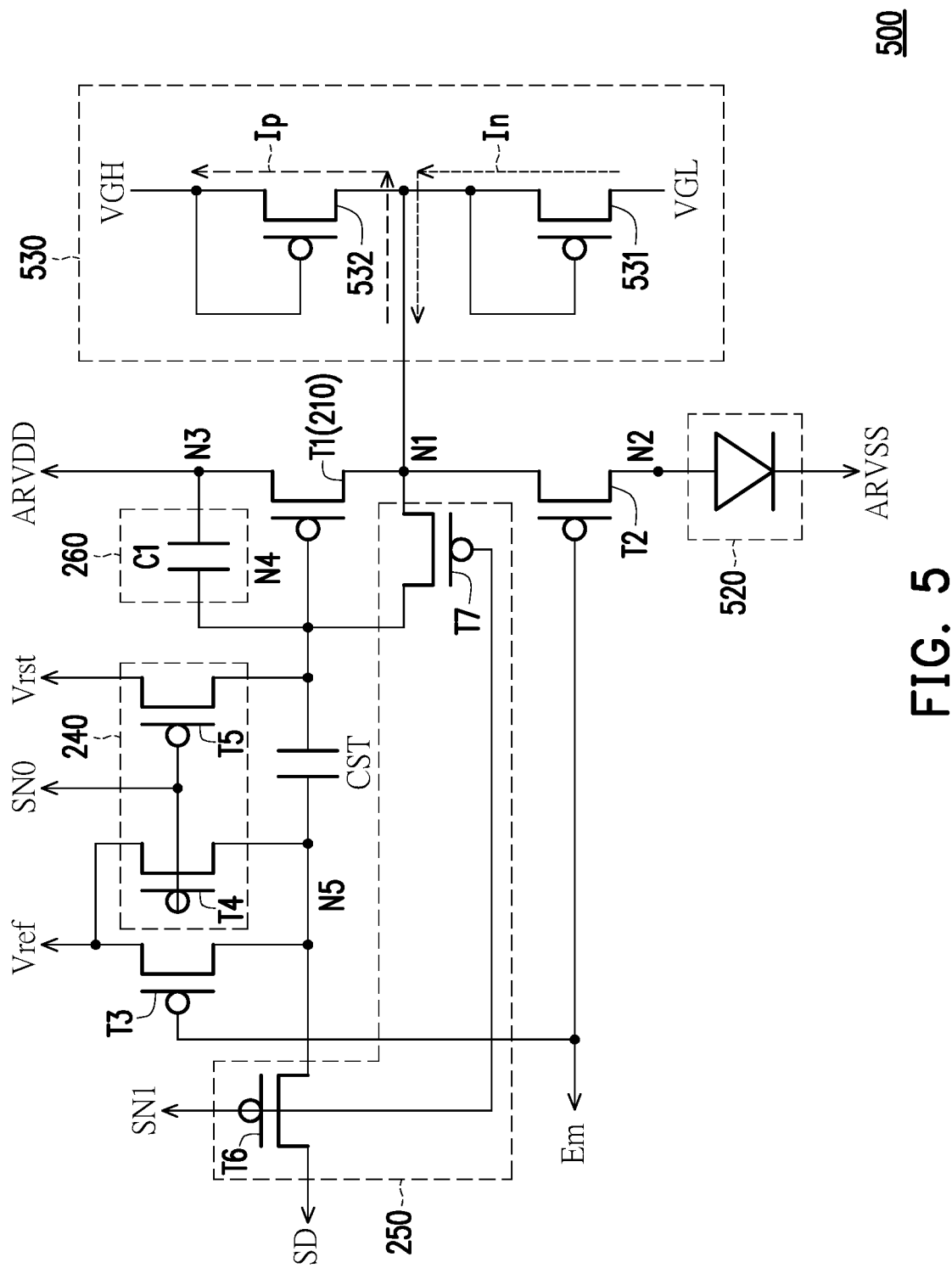
FIG. 5 is an operational schematic diagram of an electronic device according to another embodiment of the disclosure.

FIG. 5 is an operational schematic diagram of an electronic device according to another embodiment of the disclosure. In order to facilitate the description of the content of this disclosure, FIG. 5 only marks some of the elements. A semiconductor unit 520, the reset circuit 240, the writing and compensation circuit 250, the voltage regulator circuit 260, the capacitor CST, the switching transistor T2 and the switching transistor T3 included in an electronic device 500 of FIG. 5 may be deduced with reference to the related description of the electronic device 200, and therefore is not repeated herein. In this embodiment, an electrostatic discharge protection circuit 530 of FIG. 5 may be deduced with reference to the related description of the electrostatic discharge protection circuit 430 of FIG. 4, and therefore is not repeated herein.

Referring to FIG. 5, the electronic elements of the electrostatic discharge protection circuit 530 include multiple transistors 531 to 532, in which the transistors 531 to 532 may be p-type transistors. The number of the transistors 531 or the transistors 532 in this embodiment is only an example. The transistor 531 and the transistor 532 may respectively serve as diodes. Specifically, the gate terminal and the source terminal of the transistor 531 are coupled together and coupled to the node N1. The drain terminal of the transistor 531 is coupled to (receives) the fourth voltage VGL. The gate terminal and the source terminal of the transistor 532 are coupled together, and are coupled to (receives) the third voltage VGH. The drain terminal of the transistor 532 is coupled to the node N1.

In this embodiment, in the electronic device 500, the node N1 is coupled to the terminal of the electrostatic discharge protection circuit 530. Therefore, when static electricity is generated at the node N1, the electrostatic discharge protection circuit 530 is enabled to discharge the static electricity without affecting the display quality of the electronic device 500. In some embodiments, the number of terminals of the electrostatic discharge protection circuit 530 may be different according to the number of electronic elements, and the number of terminals may be, for example, two terminals, three terminals, or more than three terminals, but not limited thereto. In addition, the position where each of the terminals of the electrostatic discharge protection circuit 530 is coupled may be determined according to the requirements. For example, the reset circuit, the writing and compensation circuit, the voltage regulator circuit, the capacitor CST, the switching transistor, or the driving transistor of the electronic device 500, or any node at which the aforementioned are coupled to may all be selectively coupled to the terminal of the electrostatic discharge protection circuit 530. When the aforementioned circuits or the nodes coupled between the electronic elements and the electrostatic discharge protection circuit 530 generate static electricity, the electrostatic discharge protection circuit 530 is enabled to discharge the static electricity.

In this embodiment, during the manufacturing process of the electronic device 500, when the first voltage ARVDD and the second voltage ARVSS have not been connected to the respective DC power sources, no static electricity is formed at any node in the electronic device 500. At this time, the electrostatic discharge protection circuit 530 is disabled.

In this embodiment, when the first voltage ARVDD and the second voltage ARVSS are connected to the respective DC power sources, assuming that static electricity with positive or negative charges is formed at the node N1, the electrostatic discharge protection circuit 530 is enabled to provide a discharge loop. In some embodiments, a node (e.g., such as N2, N3, N4, or N5) may be selectively and additionally coupled to the electrostatic discharge protection circuit 530, such that when static electricity is generated at the node N2, N3, N4, or N5, the electrostatic discharge protection circuit 530 is enabled to discharge the static electricity.

For example, if the static electricity of positive charge is formed at the node N1, and the voltage of the node N1 is greater than the third voltage VGH, the transistor 532 is forwardly conducted. The positive charge electrostatic current Ip is formed by flowing from the node N1 through the transistor 532, the gate terminal and the source terminal of the transistor 532, to the third voltage VGH, and is pulled to the third voltage VGH through the transistor 532 to discharge the static electricity.

For example, if the static electricity of negative charge is formed at the node N1, and the voltage of the node N1 is lower than the fourth voltage VGL, the transistor 531 is forwardly conducted. The negative charge electrostatic current In is formed by flowing from the drain terminal of the transistor 531 through the transistor 531 and the node N1, and is pulled to the fourth voltage VGL through the transistor 531 to discharge the static electricity.

Figure 6:
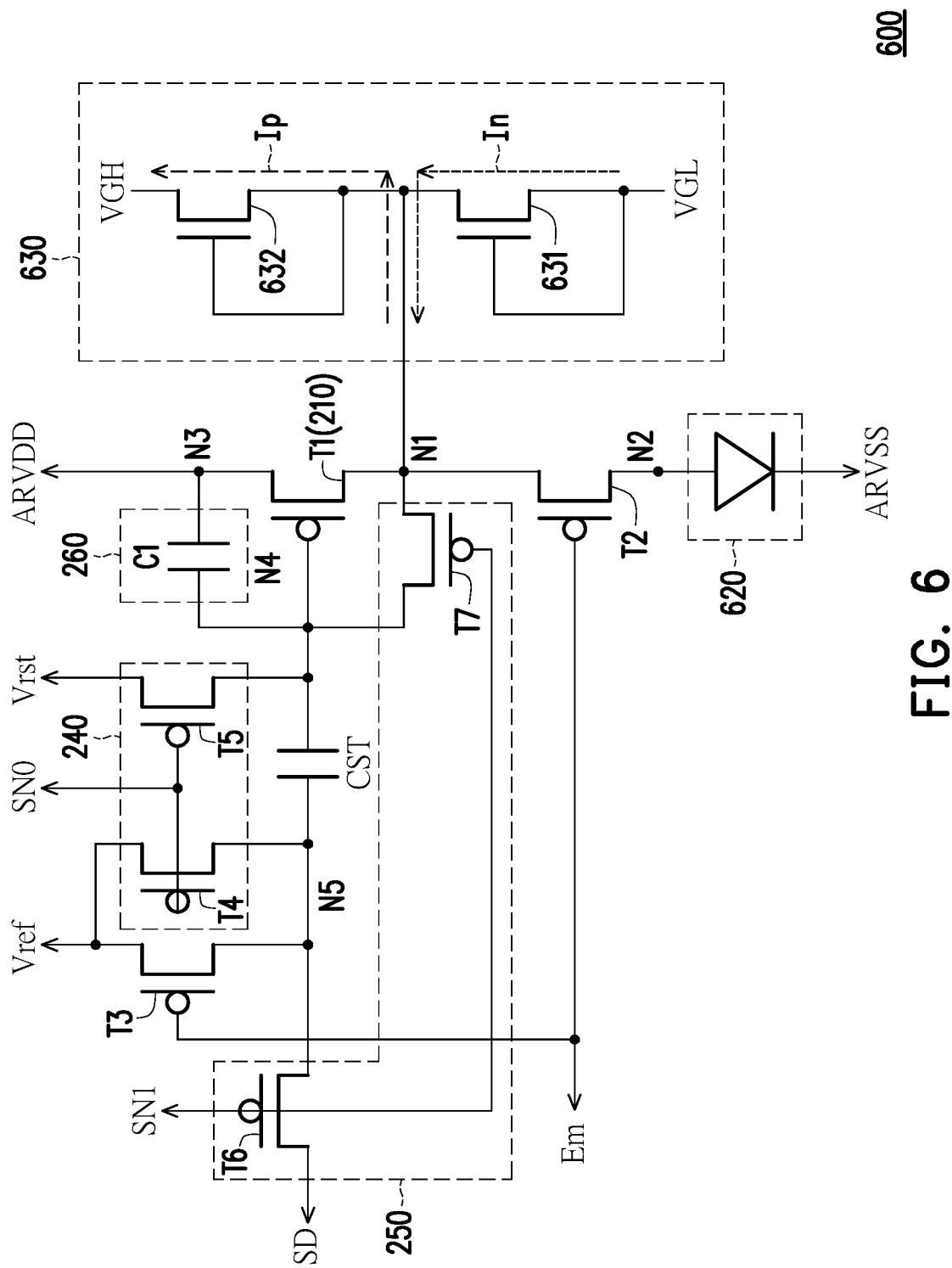
FIG. 6 is an operational schematic diagram of an electronic device according to another embodiment of the disclosure.

FIG. 6 is an operational schematic diagram of an electronic device according to another embodiment of the disclosure. In order to facilitate the description of the content of this disclosure, an electronic device 600 in FIG. 6 only marks some of the elements, such as a semiconductor unit 620 and an electrostatic discharge protection circuit 630. Other components of the electronic device 600 may be deduced with reference to the related description of the electrostatic discharge protection circuit 200 of FIG. 2, and therefore is not repeated herein. In this embodiment, an electrostatic discharge protection circuit 630 of FIG. 6 may be deduced with reference to the related description of the electrostatic discharge protection circuit 530 of FIG. 5, and therefore is not repeated herein.

Referring to FIG. 6, the electronic elements of the electrostatic discharge protection circuit 630 include multiple transistors 631 to 632, in which the transistors 631 to 632 may be n-type transistors. The number of the transistors 631 or the transistors 632 in this embodiment is only an example. The transistor 631 and the transistor 632 may respectively serve as diodes. Specifically, the drain terminal of the transistor 631 is coupled to the node N1. The gate terminal and the source terminal of the transistor 631 are coupled together, and are coupled to (receives) the fourth voltage VGL. The drain terminal of the transistor 632 is coupled to (receives) the third voltage VGH. The gate terminal and the source terminal of the transistor 632 are coupled together and coupled to the node N1.

In this embodiment, when the first voltage ARVDD and the second voltage ARVSS are connected to the respective DC power sources, if the static electricity of positive charge is formed at the node N1, and the voltage of the node N1 is greater than the third voltage VGH, the transistor 632 is forwardly turned on, such that the positive charge electrostatic current Ip is pulled to the third voltage VGH through the transistor 632 to discharge the static electricity. If the static electricity of negative charge is formed at the node N1 and the voltage of the node N1 is lower than the fourth voltage VGL, the transistor 631 is forwardly turned on, such that the negative charge electrostatic current In is pulled to the fourth voltage VGL through the transistor 631 to discharge the static electricity.

Figure 7:
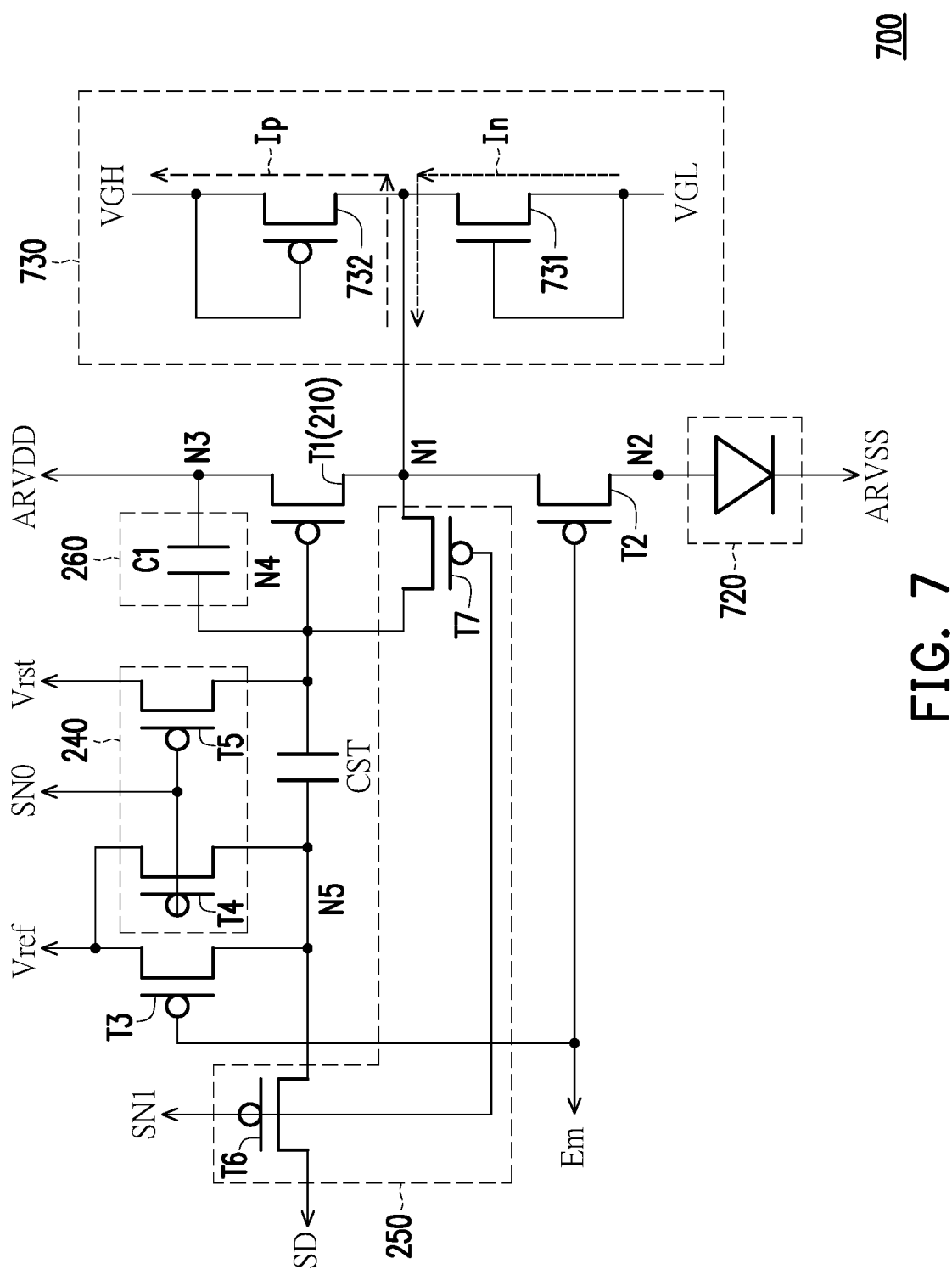
FIG. 7 is an operational schematic diagram of an electronic device according to another embodiment of the disclosure.

FIG. 7 is an operational schematic diagram of an electronic device according to another embodiment of the disclosure. In order to facilitate the description of the content of this disclosure, an electronic device 700 in FIG. 7 only marks some of the elements, such as a semiconductor unit 720 and an electrostatic discharge protection circuit 730. Other components of the electronic device 700 may be deduced with reference to the related description of the electrostatic discharge protection circuit 200 of FIG. 2, and therefore is not repeated herein. In this embodiment, an electrostatic discharge protection circuit 730 of FIG. 7 may be deduced with reference to the related description of the electrostatic discharge protection circuit 530 of FIG. 5, and therefore is not repeated herein.

Referring to FIG. 7, the electronic elements of the electrostatic discharge protection circuit 730 include a transistor 731 and a transistor 732, in which the transistor 731 may be an n-type transistor and the transistor 732 may be a p-type transistor. The number of the transistors 731 or the transistors 732 in this embodiment is only an example. The transistor 731 and the transistor 732 may respectively serve as diodes. Specifically, the drain terminal of the transistor 731 is coupled to the node N1. The gate terminal and the source terminal of the transistor 731 are coupled together, and are coupled to (receives) the fourth voltage VGL. The gate terminal and the source terminal of the transistor 732 are coupled together, and are coupled to (receives) the third voltage VGH. The drain terminal of the transistor 732 is coupled to the node N1.

In this embodiment, when the third voltage VGH and the fourth voltage VGL are connected to the respective DC power sources, if the static electricity of positive charge is formed at the node N1, and the voltage of the node N1 is greater than the third voltage VGH, the transistor 732 is forwardly turned on, such that the positive charge electrostatic current Ip is pulled to the third voltage VGH through the transistor 732 to discharge the static electricity. If the static electricity of negative charge is formed at the node N1 and the voltage of the node N1 is lower than the fourth voltage VGL, the transistor 731 is forwardly turned on, such that the negative charge electrostatic current In is pulled to the fourth voltage VGL through the transistor 731 to discharge the static electricity.

To sum up, the electronic device of the disclosure may discharge the static electricity through the discharge loop formed by the electrostatic discharge protection circuit, to prevent the driving transistor from having a shifted threshold voltage due to static electricity. In addition, if the semiconductor unit in the electronic device is a light-emitting unit, it is possible for the electronic device to avoid generating chromatic aberration. It should be noted that through selectively coupling any node of the electronic device to the terminal of the electrostatic discharge protection circuit, the static electricity at the node coupled between the electronic device and the electrostatic discharge protection circuit may be discharged through the electrostatic discharge protection circuit, thereby achieving good electrostatic discharge protection effect.

Finally, it should be noted that the foregoing embodiments are only used to illustrate the technical solutions of the disclosure, but not to limit the disclosure; although the disclosure has been described in detail with reference to the foregoing embodiments, persons of ordinary skill in the art should understand that the technical solutions described in the foregoing embodiments may still be modified, or parts or all of the technical features thereof may be equivalently replaced; however, these modifications or substitutions do not deviate the essence of the corresponding technical solutions from the scope of the technical solutions of the embodiments of the disclosure.

What is claimed is:

1. An electronic device, comprising:
a driving transistor, having a first terminal and a second terminal;
a semiconductor unit, having a first terminal and a second terminal; and
an electrostatic discharge protection circuit, coupled to a first node between the first terminal of the driving transistor and the first terminal of the semiconductor unit, and further coupled to the second terminal of the semiconductor unit and coupled to the second terminal of the driving transistor at a second node,
wherein a first charge electrostatic current is configured to flow from the first node through a first diode in the electrostatic discharge protection circuit, and a second charge electrostatic current is configured to flow from the second node through a second diode in the electrostatic discharge protection circuit.

2. The electronic device according to claim 1, wherein the first terminal of the driving transistor outputs a driving current to the semiconductor unit to drive the semiconductor unit.

3. The electronic device according to claim 1, further comprising:
a switching transistor, having a first terminal coupled to the first terminal of the semiconductor unit, wherein a second terminal of the switching transistor is coupled to the first terminal of the driving transistor.

4. The electronic device according to claim 3, wherein a control terminal of the driving transistor is coupled to a data signal, and a control terminal of the switching transistor is coupled to a switching signal.

5. The electronic device according to claim 1, wherein the second terminal of the driving transistor is coupled to a first voltage, and the second terminal of the semiconductor unit is coupled to a second voltage, wherein a voltage level of the first voltage is higher than a voltage level of the second voltage.

6. The electronic device according to claim 5, wherein the electrostatic discharge protection circuit comprises:
at least one electronic element, having a first terminal coupled to the first node.

7. The electronic device according to claim 6, wherein a second terminal of the at least one electronic element is coupled to the second voltage.

8. The electronic device according to claim 5, wherein the electrostatic discharge protection circuit comprises:
the first diode, having a first terminal coupled to the first node, wherein a second terminal of the first diode is coupled to the second voltage; and the second diode, having a first terminal coupled to the second terminal of the driving transistor, wherein a second terminal of the second diode is coupled to the second voltage.

9. The electronic device according to claim 1, further comprising:

a capacitor; and a reset circuit, having a plurality of first terminals respectively coupled to a first terminal and a second terminal of the capacitor, wherein the second terminal of the capacitor is further coupled to a control terminal of the driving transistor.

10. The electronic device according to claim 9, wherein the reset circuit further comprises:

a fourth transistor, having a first terminal coupled to the first terminal of the capacitor, wherein a second terminal of the fourth transistor is coupled to a reference voltage, and a control terminal of the fourth transistor is coupled to a first control voltage; and a fifth transistor, having a first terminal coupled to the second terminal of the capacitor, wherein a second terminal of the fifth transistor is coupled to a reset voltage, and a control terminal of the fifth transistor is coupled to the first control voltage.

11. The electronic device according to claim 9, further comprising:

a writing and compensation circuit, having a first terminal coupled to the first terminal of the capacitor, wherein a plurality of second terminals of the writing and compensation circuit are respectively coupled to the first node and the control terminal of the driving transistor.

12. The electronic device according to claim 11, wherein the writing and compensation circuit further comprises:

a sixth transistor, having a first terminal coupled to the first terminal of the capacitor, wherein a second terminal of the sixth transistor is coupled to a data signal, and a control terminal of the sixth transistor is coupled to a second control voltage; and a seventh transistor, having a first terminal coupled to the first terminal of the driving transistor at the first node, wherein a second terminal of the seventh transistor is coupled to the second terminal of the capacitor and the control terminal of the driving circuit, and a control terminal of the seventh transistor is coupled to the second control voltage.

13. The electronic device according to claim 11, further comprising:

a voltage regulator circuit, having a first terminal coupled to the control terminal of the driving transistor, wherein a second terminal of the voltage regulator circuit is coupled to the second terminal of the driving transistor and a first voltage.

14. The electronic device according to claim 13, further comprising:

a second switching transistor, having a first terminal coupled to the first terminal of the capacitor and the first terminal of the writing and compensation circuit, wherein a second terminal of the second switching transistor is coupled to a reference voltage, and a control terminal of the second switching transistor is coupled to a switching signal.

15. The electronic device according to claim 14, wherein the driving transistor, the semiconductor unit, the reset circuit, the capacitor, the writing and compensation circuit, the voltage regulator circuit, and the second switching transistor are disposed in a pixel display area.

16. The electronic device according to claim 15, wherein the electrostatic discharge protection circuit is disposed in the pixel display area, or disposed in a peripheral area outside the pixel display area.

17. The electronic device according to claim 1, wherein the semiconductor unit comprises a light-emitting diode.

\* \* \* \* \*